(12) United States Patent
Kim et al.

(10) Patent No.: US 8,906,445 B2
(45) Date of Patent: Dec. 9, 2014

(54) SHADOW MASK AND METHOD OF FABRICATING ORGANIC LIGHT-EMITTING DEVICE USING THE SAME

(75) Inventors: Jeong Hyun Kim, Gunpo-si (KR); Jae Yoon Lee, Seoul (KR); Heung Lyul Cho, Suwon-si (KR)

(73) Assignee: LG Display Co., Ltd., Seoul (KR)

( * ) Notice: Subject to any disclaimer, the term of this patent is extended or adjusted under 35 U.S.C. 154(b) by 1651 days.

(21) Appl. No.: 11/819,936

(22) Filed: Jun. 29, 2007

(65) Prior Publication Data

US 2008/0003350 A1   Jan. 3, 2008

(30) Foreign Application Priority Data

Jun. 30, 2006  (KR) .................. 10-2006-0060610

(51) Int. Cl.
*B05D 5/00* (2006.01)
*H01L 51/00* (2006.01)
*C23C 14/04* (2006.01)

(52) U.S. Cl.
CPC .......... *H01L 51/0011* (2013.01); *C23C 14/042* (2013.01)
USPC .......................................................... 427/64

(58) Field of Classification Search
USPC ............................................................ 427/64
See application file for complete search history.

(56) References Cited

U.S. PATENT DOCUMENTS

| 4,447,904 | A | * | 5/1984 | Burnham | 372/45.01 |
| 6,124,668 | A | * | 9/2000 | Shoda | 313/403 |
| 2002/0179001 | A1 | * | 12/2002 | Jung | 117/4 |
| 2003/0020975 | A1 | * | 1/2003 | Metz et al. | 359/15 |
| 2003/0228417 | A1 | * | 12/2003 | Nishikawa et al. | 427/248.1 |

FOREIGN PATENT DOCUMENTS

| CN | 1135597 | 11/1996 |
| CN | 1252796 | 5/2000 |
| CN | 1450197 | 10/2003 |

* cited by examiner

*Primary Examiner* — Robert Vetere
(74) *Attorney, Agent, or Firm* — McKenna Long & Aldridge LLP

(57) ABSTRACT

A shadow mask and a method of fabricating an OLED display using the same is disclosed, wherein the shadow mask is not sagging, and the shadow mask includes a plurality of columns, each column including a plurality of first or second cell-forming parts, wherein the first and second cell-forming parts are alternately arranged in the columns, and the first and second cell-forming parts provided in the adjacent columns include transmission parts having the different open directions.

2 Claims, 5 Drawing Sheets

SHADOW MASK AND METHOD OF FABRICATING ORGANIC LIGHT-EMITTING DEVICE USING THE SAME

This application claims the benefit of Korean Patent Application No. 2006-60610 filed on Jun. 30, 2006, which is hereby incorporated by reference for all purposes as if fully set forth herein.

BACKGROUND OF THE INVENTION

1. Field of the Invention

The present invention relates to an organic light-emitting diode, and more particularly, to a shadow mask which is not sagging, and a method of fabricating an organic light-emitting diode (OLED) display device using the shadow mask.

2. Discussion of the Related Art

One of various flat panel displays, an organic light-emitting diode (OLED) display, emits light by itself. In comparison to a liquid crystal display (LCD) device, the OLED display has the advantageous properties of wide viewing angle and high contrast ratio. It is unnecessary for the OLED display to provide a backlight unit, so that the OLED display realizes thin profile, light in weight and low power consumption.

Furthermore, the OLED display is driven by a low voltage, and the OLED display has a rapid response speed. Also, the OLED display is fabricated with a solid matter, whereby the OLED display can endure the external impact and can be used in the wide scope of temperature. Especially, the OLED display may be fabricated only by deposition and encapsulation apparatuses, so that a method of fabricating the OLED display is simplified.

When the OLED display is driven in an active matrix type where each pixel includes a thin film transistor of a switching element, the same luminance can be realized even in case of applying a low current, thereby obtaining the low power consumption, fineness, and large size of the device.

The OLED display displays images by exciting a fluorescent material using carriers including electrons and holes.

In the meantime, the OLED display is generally driven in a passive matrix type having no additional thin film transistor. However, the passive matrix type has limitations on the lower consumption and lifespan of device. Thus, there are researches and studies for an active matrix type OLED display which is suitable for a next-generation display requiring high resolution and large size.

The OLED display is divided into a lower light-emitting mode and an upper light-emitting mode based on whether an organic light-emitting layer is positioned on a lower substrate or an upper substrate. For example, when realizing the active matrix type in the upper light-emitting mode, a thin film transistor array is provided on the lower substrate and the light-emitting layer is positioned on the upper substrate, it is referred to as a dual plate type OLED (DOD) display.

Hereinafter, a related art OLED display will be described with reference to the accompanying drawings.

FIG. 1 is a cross section view of illustrating a related art OLED display. Referring to FIG. 1, the related art OLED display includes a first substrate 10, a second substrate 20, a thin film transistor array including a thin film transistor (TFT) in each sub pixel of the first substrate 10, an organic light-emitting diode (E) formed on the second substrate 20, and a seal pattern 30 formed in the circumference of first and second substrates 10 and 20. To supply a current to the organic light-emitting diode (E), there are a transparent electrode 16 and a connector 17 which connects the thin film transistor (TFT) to a second electrode 25 by each sub pixel.

At this time, the organic light-emitting diode (E) includes a first electrode 21 which functions as a common electrode, a second electrode separator 26 which is positioned in the boundaries of every sub pixel above the first electrode 21, organic light-emitting layers 22, 23 and 24, and the second electrode 25. In order to form the organic light-emitting diode (E), the first electrode 21, the second electrode separator 26, the organic light-emitting layers 22, 23 and 24 and the second electrode 25 are deposited in sequence, and then the organic light-emitting layers 22, 23 and 24 and the second electrode 25 are separated by the second electrode separator provided on the boundaries of every sub pixel.

At this time, the organic light-emitting layer includes a first carrier-transmitting layer 22, a light-emitting layer 23, and a second carrier-transmitting layer 24, which are deposited in sequence. The first and second carrier-transmitting layers 22 and 24 inject and transport electrons or holes to the light-emitting layer 23.

The first and second carrier-transmitting layers 22 and 24 are determined based on the position of anode and cathode. For example, supposing that the light-emitting layer 23 is selected from a high molecular substance, the first electrode 21 serves as the anode, and the second electrode 25 serves as the cathode. In this case, the first carrier-transmitting layer 22 which is positioned adjacent to the first electrode 21 includes a hole injection layer and a hole transporting layer deposited in sequence, and the second carrier-transmitting layer 24 which is positioned adjacent to the second electrode 25 includes an electron injection layer and an electron transporting layer deposited in sequence.

Also, the first and second carrier-transmitting layers 22 and 24 and the light-emitting layer 23 may be formed of the high molecular substance or low molecular substance. When using the low molecular substance, they are formed by a vacuum deposition method. Meanwhile, when using the high molecular substance, they are formed by an ink jet method.

Unlike a general spacer for the LCD device, a conductive spacer 17 functions as an electric connector between the two substrates as well as cell-gap maintenance. The conductive spacer 17 has a predetermined height between the two substrates.

The thin film transistor (TFT) corresponds to a driving thin film transistor connected to the organic light-emitting diode (E). The thin film transistor (TFT) includes a gate electrode 11 which is formed on a predetermined portion of the first substrate 10, a semiconductor layer 13 which is formed in shape of an island to cover the gate electrode 11, and source and drain electrodes 14a and 14b which are formed at both sides of the semiconductor layer 13. In addition, a gate insulation layer 12 is formed on an entire surface of the first substrate 10, wherein the gate insulation layer 12 is interposed between the gate electrode 11 and the semiconductor layer 13. Then, a passivation layer is formed on the gate insulation layer 12 including the source and drain electrodes 14a and 14b. At this time, the drain electrode 14b is electrically connected to the transparent electrode 16 formed on the passivation layer 15 through a contact hole formed in the passivation layer 15. The upper side of transparent electrode 16 is brought into contact with the conductive spacer 17.

The conductive spacer 17 electrically connects the drain electrode 14b of thin film transistor (TFT) provided by each sub pixel to the second electrode 25 formed on the second substrate 20. The conductive spacer 17 is formed by coating a column-shaped spacer of organic insulation material with a metal material. The sub pixels of first substrate 10 are electrically connected to the sub pixels of second substrate 20 by a one-to-one correspondence.

The metal material for the conductive spacer 17 is selected from a conductive material, preferably, a metal material having the softness and low resistance value. At this time, the first electrode 21 is formed of a transparent electrode material, and the second electrode 25 is formed of a light-shielding metal layer. Also, the interval between the first and second substrates 10 and 20 may be filled with an inert gas or an insulating liquid.

Although not shown, the first substrate 10 includes a scanning line, a signal line crossing the scanning line at a predetermined interval with each other, a power supplying line and a storage capacitor.

For a dual plate type OLED display, there is a bus line formed in shape of a grid on the first electrode 21 of a transparent electrode material having a high resistivity. The bus line prevents a voltage value from being lowered on the first electrode 21.

In the meantime, the organic light-emitting layer is formed on the second substrate 20. The organic light-emitting layer is formed of an organic light-emitting material which emits a predetermined light, for example R, G and B light, for each sub pixel.

FIG. 2 is a plane view of illustrating a shadow mask to form the related art OLED display.

As shown in FIG. 2, the shadow mask 40 is provided with a plurality of cell-forming parts 45, wherein the plurality of cell-forming parts 45 are regularly arranged in the same direction at fixed intervals. Each of the cell-forming parts 45 formed in the shadow mask 40 is provided with a plurality of transmission parts 51 which correspond to R, G and B organic light-emitting layers. At this time, the line width of each of the transmission parts 51 is identical to the line width of each of the R, G and B organic light-emitting layers.

The plurality of transmission parts 51 provided in each of the cell-forming parts 45 are formed in the same direction at fixed intervals. Except the transmission parts 51, the other portions of shadow mask 40 are defined with a masking part 41.

Each of the cell-forming parts 45 is identical in size to one cell corresponding to one OLED display, wherein one cell is provided with a plurality of pixels.

In the process of fabricating the OLED display using the related art shadow mask 40, the organic light-emitting layer is formed on the substrate through each of the transmission parts 51 of the shadow mask 40. At this time, when the shadow mask 40 is held by the evaporation apparatus, and is maintained by a predetermined space from the evaporation apparatus for a preset period of time, the central portion of shadow mask 40 or the other portion adjacent to the transmission part may be sagging due to the gravity.

Especially, as shown in FIG. 2, when using the shadow mask 40 including the plurality of cell-forming parts, a slit type is more advantageous than a slot type having a transmission part in a corresponding pixel in that the slit is easily formed in desired size without decrease in width of the organic light-emitting layer. In this case, the mask is more severely sagged in a length direction of the transmission part due to the large length of slit, wherein the length of the silt is corresponding to that of the transmission part.

The related art shadow mask has the following disadvantages.

When using the shadow mask 40 including the plurality of cell-forming parts, the slit type is more advantageous than the slot type having the transmission part in the corresponding pixel in that the slit is easily formed in desired size without decrease in width of the organic light-emitting layer. In this case, the mask is more severely sagged due to the large length of slit.

The organic light-emitting layer of OLED display is formed by the evaporation deposition method. In this case, the organic light-emitting layer is formed on the portion exposed by the shadow mask. At this time, when the shadow mask 40 is held by the evaporation apparatus, and is maintained by the predetermined space from the evaporation apparatus for a preset period of time, the central portion of shadow mask or the other portion adjacent to the transmission part may be sagging due to the gravity. As the shadow mask is sagging, it is difficult to form the organic light-emitting layer normally. Accordingly, the organic light-emitting layer may be larger or smaller than the desired size, or may be formed in the other portion being apart from the desired portion. Especially, if the transmission parts of shadow mask are provided with the long slits formed at the same direction, the shadow mask may be more severely sagging.

In order to overcome this problem, a magnetic force may be applied to the shadow mask which is formed of the metal material, to thereby lift up the shadow mask. However, there is a requirement for providing an additional apparatus to apply the magnetic force to the shadow mask, thereby increasing the fabrication costs of the device.

SUMMARY OF THE INVENTION

Accordingly, the present invention is directed to a shadow mask and a method of fabricating an OLED display using the same that substantially obviates one or more problems due to limitations and disadvantages of the related art.

An advantage of the present invention is to provide a shadow mask which is not sagging, and a method of fabricating an organic light-emitting diode (OLED) display device using the shadow mask.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the invention, as embodied and broadly described herein, a shadow mask includes a plurality of columns, each column including a plurality of first or second cell-forming parts, wherein the first and second cell-forming parts are alternately arranged in the columns, and the first and second cell-forming parts provided in the adjacent columns include a plurality of transmission parts having different open directions.

At this time, the transmission parts provided in the cell-forming parts for each column have the same open direction.

Also, the column provided with the transmission parts having the first direction alternates with the column provided with the transmission parts having the second direction.

Also, the first and second directions cross each other.

Also, the first direction is orthogonal to the second direction.

In another aspect, a shadow mask includes a plurality of columns and rows, each column including a plurality of first or second cell-forming parts, each cell-forming part including a plurality of transmission parts, wherein the first cell-forming parts are positioned in the odd-numbered rows, and the second cell-forming parts are positioned in the even-numbered rows.

At this time, the transmission parts provided in the cell-forming parts for each column have the same open direction.

Also, the transmission parts provided in the cell-forming parts for the columns have the same open direction.

Also, the first cell-forming parts provided with the transmission parts having the first direction alternate with the second cell-forming parts provided with the transmission parts having the second direction.

Also, the first and second directions cross each other.

Also, the first direction is orthogonal to the second direction.

In another aspect, a method of fabricating an OLED display includes preparing a shadow mask including a plurality of columns, each column including a plurality of first or second cell-forming parts, wherein the first and second cell-forming parts are alternately arranged in the columns, and the first and second cell-forming parts provided in the adjacent columns include a plurality of transmission parts having different open directions; positioning the shadow mask below a substrate; and forming an organic light-emitting layer by supplying an organic light-emitting material layer from an organic light-emitting material supplier positioned below the shadow mask to the substrate through the transmission parts of shadow mask.

In another aspect, a method of fabricating an OLED display includes preparing a shadow mask including a plurality of columns and rows, each column including a plurality of first or second cell-forming parts, each cell-forming part including a plurality of transmission parts, wherein the first cell-forming parts are positioned in the odd-numbered rows, and the second cell-forming parts are positioned in the even-numbered rows; positioning the shadow mask below a substrate; and forming an organic light-emitting layer by supplying an organic light-emitting material layer from an organic light-emitting material supplier positioned below the shadow mask to the substrate through the transmission parts of shadow mask.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Reference will now be made in detail to embodiments of the present invention, examples of which are illustrated in the accompanying drawings. Wherever possible, the same reference numbers will be used throughout the drawings to refer to the same or like parts.

Figure 1:
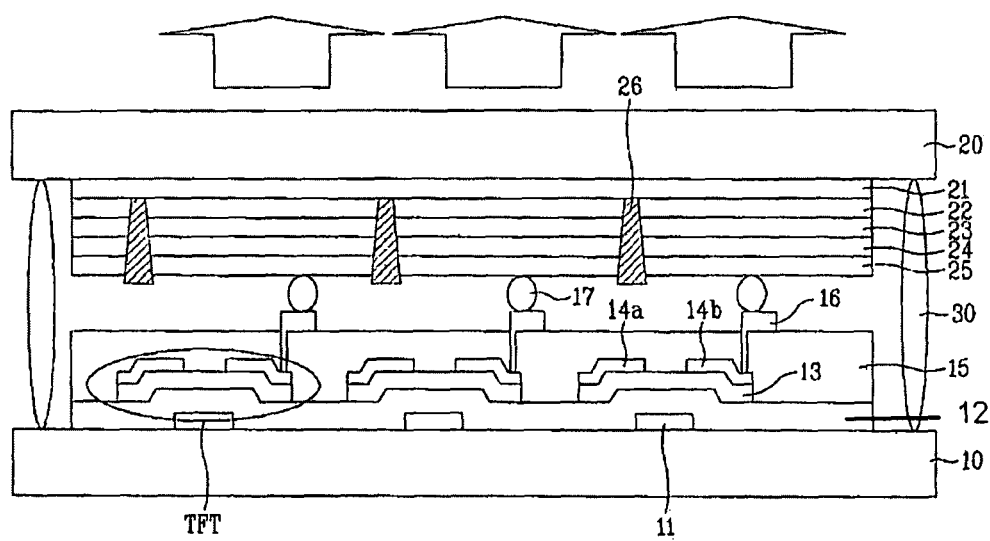
FIG. 1 is a cross section view of illustrating a dual plate type OLED display according to the related art.
Figure 2:
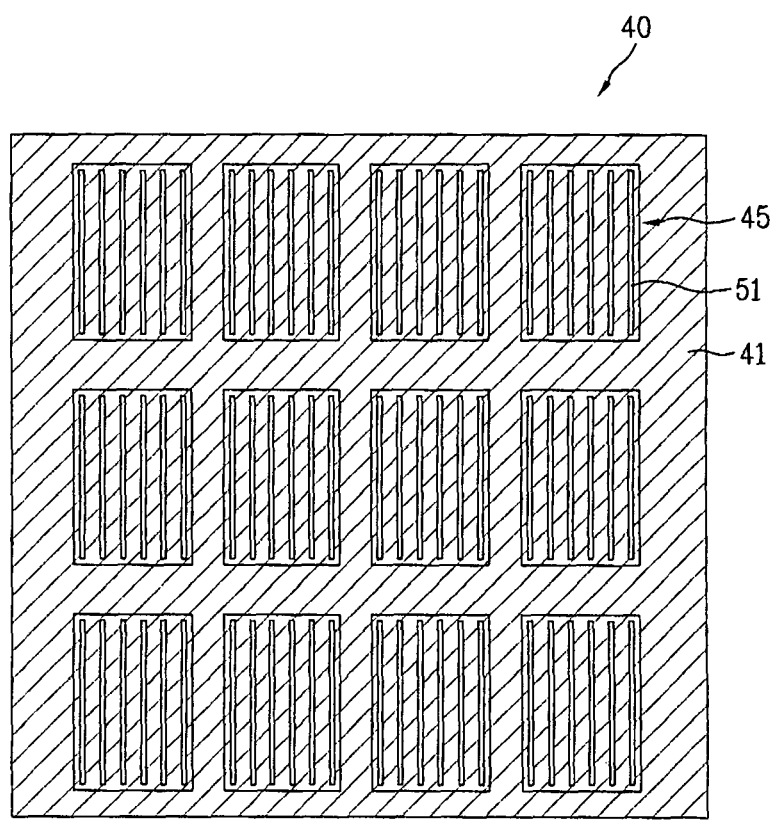
FIG. 2 is a plane view of illustrating a shadow mask to fabricate an OLED display according to the related art.
Figure 3:
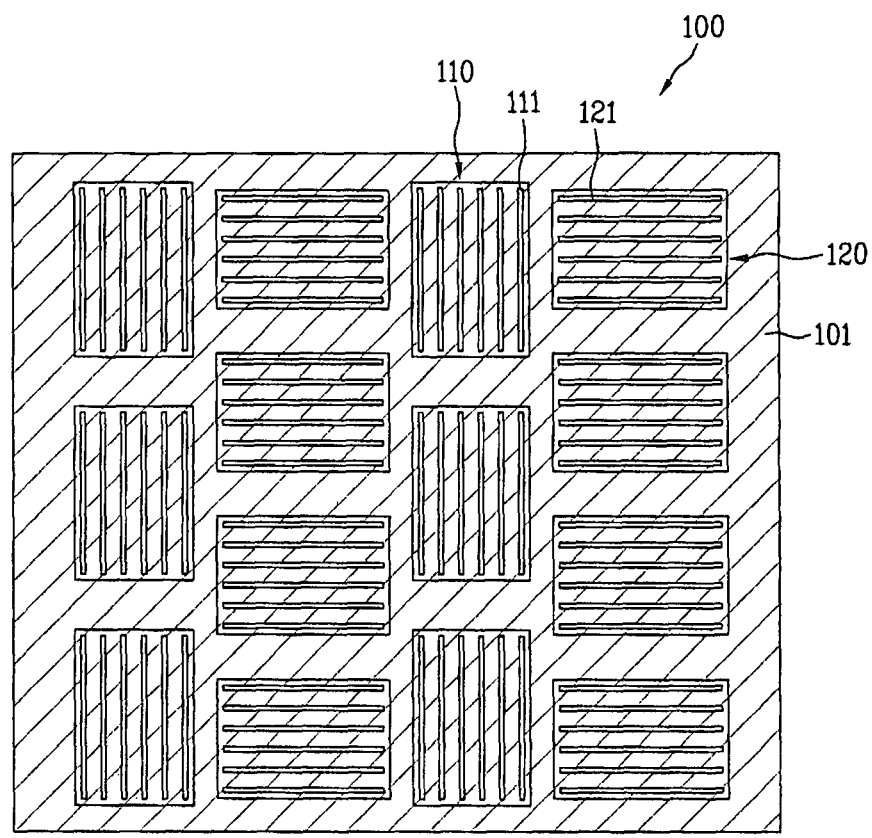
FIG. 3 is a plane view of illustrating a shadow mask according to the first embodiment of the present invention.

FIG. 3 is a plane view of illustrating a shadow mask of an OLED display according to the first embodiment of the present invention.

As shown in FIG. 3, the shadow mask according to the first embodiment of the present invention is defined with a plurality of columns. Along each of the columns, there are a plurality of first or second cell-forming parts 110 or 120, wherein each of first and second cell-forming parts 110 and 120 is provided with a plurality of transmission parts 111. At this time, the transmission parts 111 provided in the adjacent columns are perpendicular with each other. For example, the transmission part provided in the even-numbered column is perpendicular to the transmission part provided in the odd-numbered column. For the same column, the transmission parts 111 are arranged in the same direction. Referring to FIG. 3, along the same column of shadow mask 100, the transmission parts 111 positioned in the adjacent cell-forming parts 110 or 120 may be arranged in the same vertical line or in the different vertical lines.

On the assumption that the shadow mask 100 includes 'n' columns, the first cell-forming part 110 having the transmission part 111 of a first direction is formed in the first column; and the second cell-forming part 120 having the transmission part 121 of a second direction is formed in the second column. In this case, the open direction of each transmission part 111 provided in the first column is different from the open direction of each transmission part 121 provided in the second column.

The first direction of the transmission part 111 provided in the first cell-forming part of the first column may be orthogonal or slant to the second direction of the transmission part 121 provided in the second cell-forming part of the second column. As the transmission part 111 provided in the first cell-forming part 110 is provided at the different direction as the transmission part 121 provided in the second cell-forming part 120, it is possible to compensate for the shadow mask sagging at the different directions. Especially, it is possible to prevent the sag in the central portion of shadow mask caused by the gravity.

At this time, the transmission parts 111 and 121 are formed as the open type. Except the transmission parts, the other portions of shadow mask 100 are defined with a masking part 101. In an evaporation deposition, a material is evaporated and is then deposited on a substrate (not shown) through the transmission parts 111 and 121 of shadow mask. In case of the masking part 101, the evaporated material is not transmitted therethrough.

In the first embodiment of the present invention, the shadow mask 100 has the first and second cell-forming parts which are different from each other. This is because the shadow mask is more severely sagging due to the increased open area caused by the transmission parts arranged in the same direction on the slit type.

In this respect, the shadow mask 100 according to the first embodiment of the present invention has both the transmission part 111 having the first direction and the transmission part 121 having the second direction, wherein the odd-numbered column having the transmission part 111 of the first direction alternates with the even-numbered column having the transmission part 121 of the second direction, thereby preventing the shadow mask from sagging due to the tension of a predetermined direction.

Figure 4:
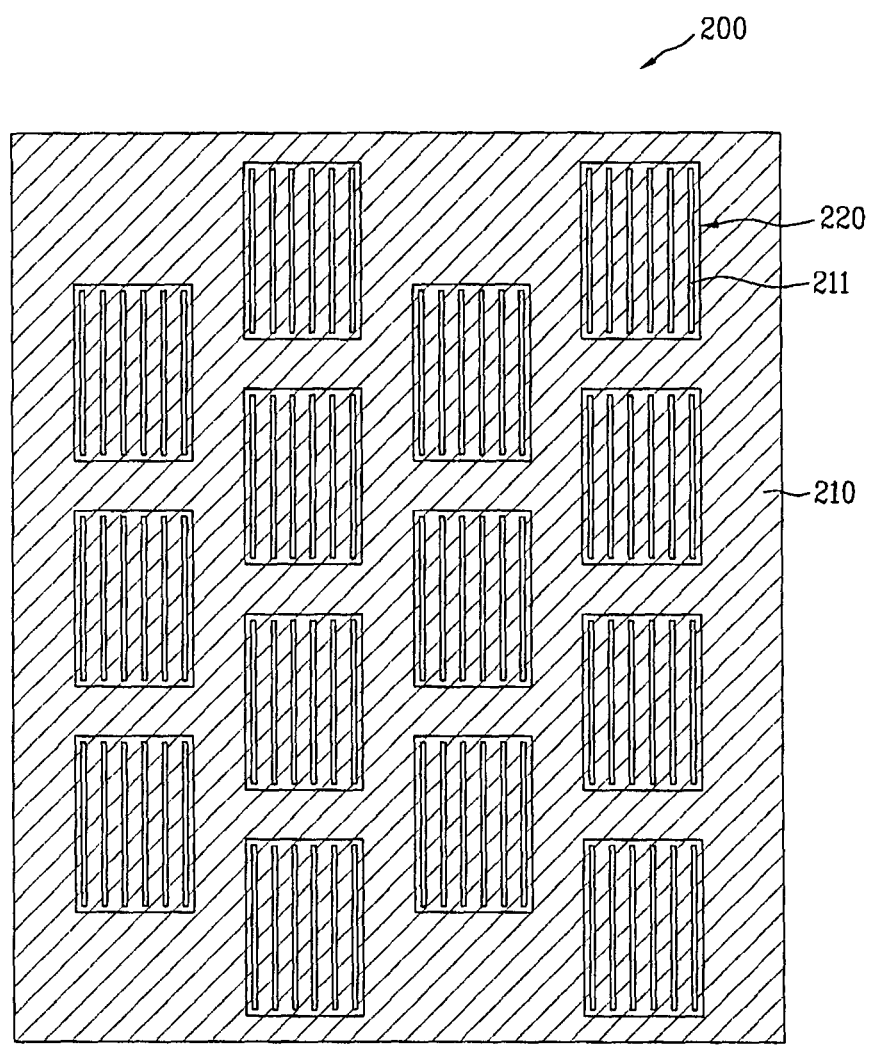
FIG. 4 is a plane view of illustrating a shadow mask according to the second embodiment of the present invention.

FIG. 4 is a plane view of illustrating a shadow mask according to the second embodiment of the present invention.

Referring to FIG. 4, the shadow mask 200 according to the second embodiment of the present invention is defined with a plurality of columns and rows. Along each of the columns, there are a plurality of first or second cell-forming parts 210 or 220, wherein each of the first and second cell-forming parts 210 and 220 is provided with a plurality of transmission parts 211. At this time, the first cell-forming parts 210 are positioned in the odd-numbered row of shadow mask 200; and the second cell-forming parts 220 are positioned in the even-numbered row of shadow mask 200. Also, the transmission parts 211 of the first and second cell-forming parts 210 and 220 are arranged in the same direction.

Although not shown, the first cell-forming part is provided with a first direction, and the second cell-forming part is provided with a second direction, wherein the first direction of first cell-forming part is different from the second direction of second cell-forming part. For example, when providing the plurality of cell-forming parts based on the arrangement of FIG. 4, the first direction of first cell-forming part may be orthogonal or slant to the second direction of second cell-forming part.

A method of fabricating an OLED display using the shadow mask 200 according to the second embodiment of the present invention will be described as follows.

First, the shadow mask 200 is prepared, which is defined with the plurality of columns and rows. Along each of the columns provided in the shadow mask 200, there are the plurality of first or second cell-forming parts 210 or 220, wherein each of the first and second cell-forming parts 210 and 220 is provided with the plurality of transmission parts 211. At this time, the first cell-forming parts 210 are positioned in the odd-numbered row of shadow mask 200; and the second cell-forming parts 220 are positioned in the even-numbered row of shadow mask 200. Also, the transmission parts 211 of the first and second cell-forming parts 210 and 220 are arranged in the same direction.

Then, the shadow mask 200 is positioned below the substrate (not shown), and an organic light-emitting material supplier is positioned below the shadow mask 200. Thus, the organic light-emitting material supplier supplies an organic light-emitting material to the substrate (not shown) through the transmission parts of shadow mask, whereby the organic light-emitting material is formed on the substrate.

Figure 5:
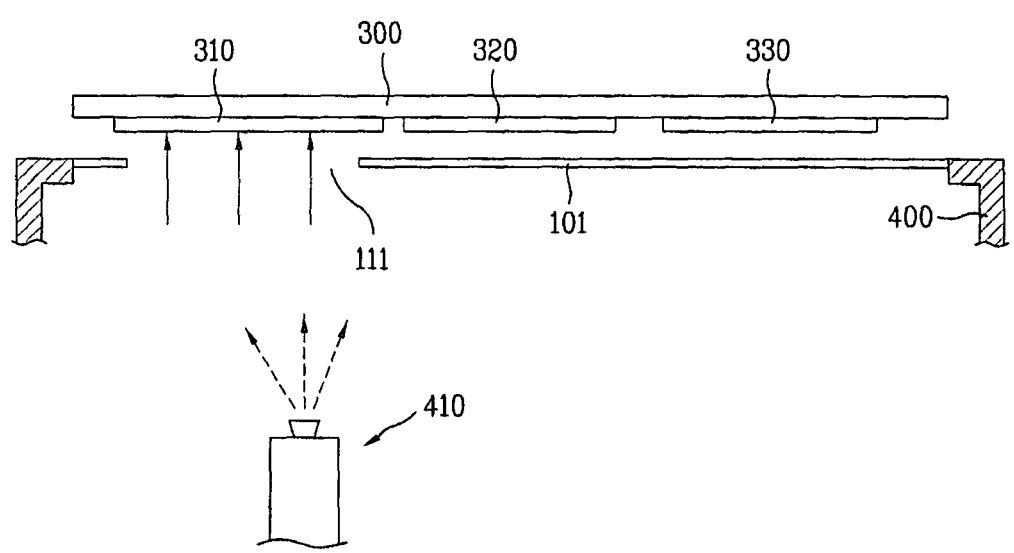
FIG. 5 is a view of illustrating a method of fabricating an organic light-emitting layer of OLED display using a shadow mask according to the preferred embodiment of the present invention.

FIG. 5 is a view of illustrating a method of fabricating the organic light-emitting layer of OLED display using the shadow mask according to an embodiment of the present invention.

As shown in FIG. 5, the organic light-emitting material to emit the predetermined-colored light to the transmission part 111 of the shadow mask 100 or 200 is evaporated so that a first organic light-emitting layer 310 is formed. At this time, an organic light-emitting material supplier 410 to supply the organic light-emitting material is positioned below the shadow mask 100. Also, the organic light-emitting material is supplied in the vapor state at a high temperature. Thus, the vapor of light-emitting material is adhered onto the surface of the exposed substrate 300. In this case, the outer side of shadow mask 100 is supported by a frame 400, whereby the shadow mask 100 is positioned above the organic light-emitting material supplier 410 and below the substrate 300.

As shown in FIG. 5, the first organic light-emitting layer 310 is formed in the corresponding sub pixel after forming second and third organic light-emitting layers 320 and 330 in the other sub pixels. To form the second and third organic light-emitting layers 320 and 330, the same shadow mask 100 is shifted by one sub pixel or two sub pixels.

A method of forming the organic light-emitting layer of OLED display using the shadow mask 100 will be described as follows.

First, the shadow mask 100 is prepared, which is positioned below the substrate. Also, the organic light-emitting material supplier 410 is positioned below the shadow mask 100. Then, the organic light-emitting material is supplied to the substrate through the transmission parts of the shadow mask 100, whereby the corresponding organic light-emitting layer is formed on the predetermined portion of the substrate 300.

The shadow mask 100 according to the first or second embodiment of the present invention may be used. For the shadow mask 100 according to the first embodiment of the present invention, there are the plurality of columns, and there are the plurality of first or second cell-forming parts along each of the columns, wherein each of the first and second cell-forming parts is provided with the plurality of transmission parts, and the transmission parts provided in the adjacent columns are perpendicular with each other.

For the shadow mask according to the second embodiment of the present invention, there are the plurality of columns and rows, and there are the plurality of first or second cell-forming parts along each of the columns, each of the first and second cell-forming parts provided with a plurality of transmission parts, wherein the first cell-forming parts are positioned in the odd-numbered row of shadow mask; the second cell-forming parts are positioned in the even-numbered row of shadow mask; and the transmission parts of the first and second cell-forming parts are arranged in the same direction.

As mentioned above, the shadow mask according to the present invention and the method of fabricating the OLED display using the shadow mask have the following advantages.

For the related art shadow mask, the central portion of shadow mask may be sagging more than the edge of shadow mask due to the gravity applied to the shadow mask. Especially, if the transmission parts of shadow mask are provided in the slit types, the open directions of the transmission parts are the same, so that the shadow mask is more severely sagging due to the slit-type transmission parts.

In the meantime, the slit-type shadow mask according to the present invention includes the plurality of columns and rows. Along each of the columns, there are the plurality of first or second cell-forming parts, wherein each of first and second cell-forming parts is provided with a plurality of transmission parts. At this time, the open directions of the transmission parts provided in the adjacent columns are different from each other, thereby strengthening the tension of the shadow mask. As a result, it is possible to prevent the shadow mask from sagging down.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method of fabricating an OLED display comprising:
preparing a shadow mask including a plurality of odd and even-numbered columns divided by first shielding parts, each odd-numbered column including a plurality of first cell-forming parts divided by second shielding parts and each even-numbered column including a plurality of second cell-forming parts divided by third shielding parts, wherein the first and second cell-forming parts provided in the adjacent columns include a plurality of transmission parts formed as the open type having different open directions and a plurality of fourth shielding parts formed between the transmission parts;

positioning the shadow mask below a substrate; and forming an organic light-emitting layer by supplying the organic light-emitting material layer from the organic light-emitting material supplier positioned below the shadow mask to the substrate through the transmission parts of the shadow mask while shielding the organic light-emitting material layer from an organic light-emitting material supplier through the first to fourth shielding parts of the shadow mask.

2. A method of fabricating an OLED display comprising:

preparing a shadow mask including a plurality of odd and even-numbered columns and rows, each odd-numbered column including a plurality of first cell-forming parts and each even-numbered column including a plurality of second cell-forming parts, each cell-forming part including a plurality of transmission parts formed as the open type, wherein the first cell-forming parts are positioned in the odd-numbered rows, and the second cell-forming parts are positioned in the even-numbered rows, and wherein the shadow mask has shielding parts between the first cell-forming parts in each odd-numbered column, between the second cell-forming parts in each even-numbered column and between the transmission parts of each cell-forming part;

positioning the shadow mask below a substrate; and forming the organic light-emitting layer by supplying an organic light-emitting material layer from an organic light-emitting material supplier positioned below the shadow mask to the substrate through the transmission parts of the shadow mask while shielding the organic light-emitting material layer from the organic light-emitting material supplier through the shielding parts of the shadow mask, wherein all of the transmission parts of the first and the second cell-forming parts are of identical width and length and are formed in the same direction at fixed intervals.

* * * * *